US012770934B2

(12) United States Patent
Inamura et al.

(10) Patent No.: US 12,770,934 B2
(45) Date of Patent: Oct. 20, 2026

(54) BATTERY MODULE

(71) Applicant: Prime Planet Energy & Solutions, Inc., Tokyo (JP)

(72) Inventors: Takashi Inamura, Himeji (JP); Takatoshi Kageyama, Kakogawa (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 549 days.

(21) Appl. No.: 18/451,101

(22) Filed: Aug. 17, 2023

(65) Prior Publication Data

US 2024/0088456 A1 Mar. 14, 2024

(30) Foreign Application Priority Data

Sep. 5, 2022 (JP) ................................ 2022-140757

(51) Int. Cl.

| | |
|---|---|
| ***H01M 10/42*** | (2006.01) |
| ***H01M 10/44*** | (2006.01) |
| ***H01M 50/204*** | (2021.01) |
| ***H01M 50/284*** | (2021.01) |
| ***H05K 1/18*** | (2026.01) |
| ***H05K 1/189*** | (2026.01) |

(52) U.S. Cl.
CPC ....... *H01M 10/425* (2013.01); *H01M 10/441* (2013.01); *H01M 50/204* (2021.01); *H01M 50/284* (2021.01); *H05K 1/189* (2013.01); *H01M 2220/20* (2013.01)

(58) Field of Classification Search
CPC ............ H01M 10/425; H01M 10/441; H01M 50/204; H01M 50/284; H01M 2220/20; H01M 50/209; H01M 50/519; H01M 50/503; H05K 1/189; Y02E 60/10
See application file for complete search history.

(56) References Cited

U.S. PATENT DOCUMENTS

| | | | | |
|---|---|---|---|---|
| 2008/0008910 A1* | 1/2008 | Koh | H01M 10/425 | 361/103 |
| 2010/0151281 A1* | 6/2010 | Kwag | H01M 10/0436 | 429/7 |
| 2013/0252074 A1* | 9/2013 | Hsiao | H01M 10/425 | 429/159 |

(Continued)

FOREIGN PATENT DOCUMENTS

| | | | | |
|---|---|---|---|---|
| CN | 100569044 C | * 12/2009 | H01R 12/62 |
| CN | 205863576 U | * 1/2017 | Y02E 60/10 |

(Continued)

*Primary Examiner* — Kaity V Chandler
(74) *Attorney, Agent, or Firm* — HAUPTMAN HAM, LLP

(57) ABSTRACT

A flexible printed board has deflection with the flexible printed board and a control board being connected to each other. A positioning portion for the flexible printed board on a plate member is provided. The positioning portion is provided with a protrusion provided in the plate member and a hole provided in the flexible printed board. The flexible printed board is positioned by a side surface of the hole being pressed against the protrusion due to the deflection of the flexible printed board. The protrusion includes a columnar portion that extends substantially vertically from a main surface of the plate member, and a projection that projects from the columnar portion in a direction intersecting the columnar portion.

16 Claims, 7 Drawing Sheets

(56) References Cited

U.S. PATENT DOCUMENTS

| | | | | |
|---|---|---|---|---|
| 2015/0295280 | A1* | 10/2015 | Cho | H01M 10/4207 429/158 |
| 2016/0336573 | A1 | 11/2016 | Osanai et al. | |
| 2016/0372796 | A1 | 12/2016 | Nishihara | |
| 2017/0244139 | A1* | 8/2017 | Tononishi | H01G 9/0029 |
| 2019/0389318 | A1* | 12/2019 | Lee | B60L 50/50 |
| 2020/0035979 | A1* | 1/2020 | Yamamoto | H01G 9/26 |
| 2022/0013868 | A1 | 1/2022 | Takahashi et al. | |
| 2022/0037735 | A1 | 2/2022 | Shimizu et al. | |

FOREIGN PATENT DOCUMENTS

| | | | | | |
|---|---|---|---|---|---|
| CN | 104979517 | B | * | 8/2019 | H01M 50/507 |
| CN | 110785874 | A | * | 2/2020 | H01M 10/425 |
| JP | 2009163291 | A | * | 7/2009 | G06F 1/1616 |
| JP | 2012-227002 | A | | 11/2012 | |
| JP | 2015138604 | A | * | 7/2015 | Y02E 60/10 |
| JP | 2020-087665 | A | | 6/2020 | |
| JP | 2021-068696 | A | | 4/2021 | |
| JP | 2021-072289 | A | | 5/2021 | |
| JP | 2022-025297 | A | | 2/2022 | |
| KR | 20090047778 | A | * | 5/2009 | H01M 10/0566 |
| KR | 20090055844 | A | * | 6/2009 | H01M 50/581 |
| WO | 2015/107583 | A1 | | 7/2015 | |
| WO | 2015/159524 | A1 | | 10/2015 | |
| WO | WO-2018164362 | A1 | * | 9/2018 | H01M 50/50 |

* cited by examiner

BATTERY MODULE

CROSS REFERENCE TO RELATED APPLICATIONS

This nonprovisional application is based on Japanese Patent Application No. 2022-140757 filed on Sep. 5, 2022 with the Japan Patent Office, the entire contents of which are hereby incorporated by reference.

BACKGROUND OF THE INVENTION

Field of the Invention

The present technology relates to a battery module.

Description of the Background Art

A flexible printed board may be used as a wiring of a battery module including a plurality of battery cells.

Technologies described in WO 2015/107583, Japanese Patent Laying-Open No. 2021-68696, and Japanese Patent Laying-Open No. 2021-72289 are exemplified as background technologies.

SUMMARY OF THE INVENTION

Since the flexible printed board is likely to be deformed, deflection may occur during assembling to cause unintended rising thereof. It has been required to improve assemblability of the flexible printed board.

It is an object of the present technology to provide a battery module allowing for high assemblability of a flexible printed board.

The present technology provides the following battery module.

[1] A battery module comprising: a plurality of battery cells arranged in a first direction; a plate member provided on the plurality of battery cells; a flexible printed board provided on the plate member; a control board provided on the plate member and electrically connected to the flexible printed board; a connector portion provided between the flexible printed board and the control board, wherein the flexible printed board and the control board are electrically connected to each other via the connector portion, the flexible printed board has deflection with the flexible printed board and the control board being connected to each other, a positioning portion for the flexible printed board on the plate member is provided, the positioning portion is provided with a protrusion provided in the plate member and a hole provided in the flexible printed board, and the flexible printed board is positioned by a side surface of the hole being pressed against the protrusion due to the deflection of the flexible printed board, and the protrusion includes a columnar portion that extends substantially vertically from a main surface of the plate member, and a projection that projects from the columnar portion in a direction intersecting the columnar portion.

[2] The battery module according to [1], wherein the projection projects from the columnar portion toward the connector portion side.

[3] The battery module according to [1] or [2], wherein the hole provided in the flexible printed board is an elongated hole, and a side surface of the elongated hole is pressed against the protrusion along an extending direction of the elongated hole.

[4] The battery module according to any one of [1] to [3], wherein the protrusion has a substantially L-shaped longitudinal cross sectional shape.

[5] The battery module according to any one of [1] and [4], wherein the control board includes a control circuit that controls charging and discharging of each of the plurality of battery cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
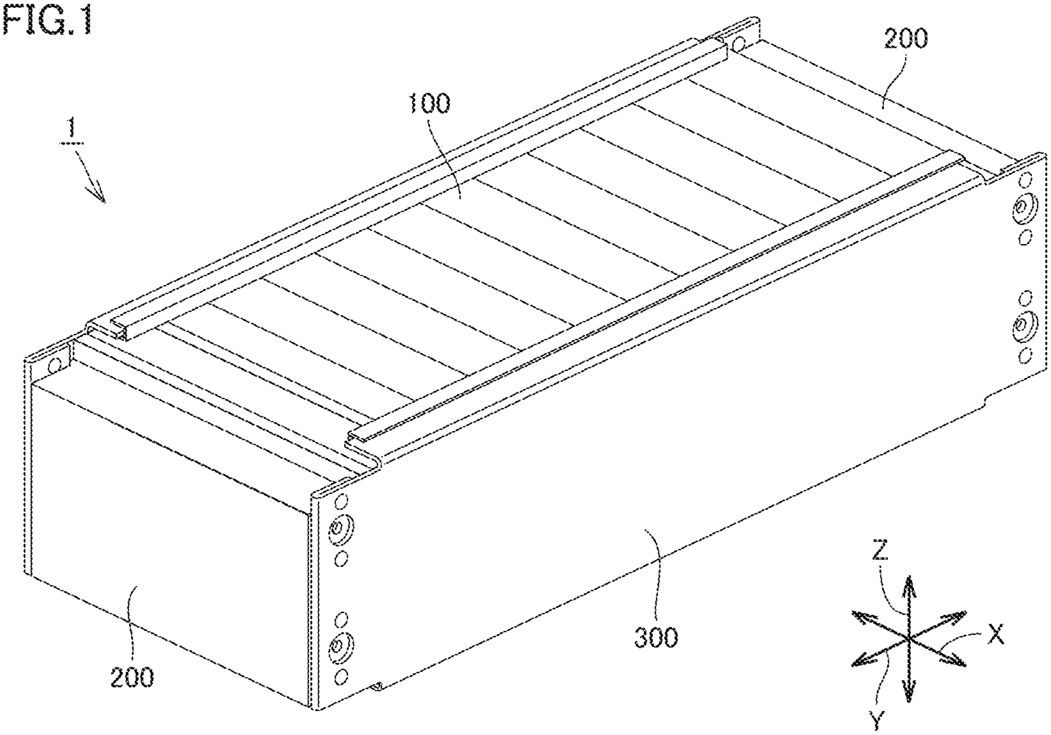
FIG. 1 is a diagram showing a basic configuration of a battery module.

Hereinafter, embodiments of the present technology will be described. It should be noted that the same or corresponding portions are denoted by the same reference characters, and may not be described repeatedly.

It should be noted that in the embodiments described below, when reference is made to number, amount, and the like, the scope of the present technology is not necessarily limited to the number, amount, and the like unless otherwise stated particularly. Further, in the embodiments described below, each component is not necessarily essential to the present technology unless otherwise stated particularly. Further, the present technology is not limited to one that necessarily exhibits all the functions and effects stated in the present embodiment.

It should be noted that in the present specification, the terms “comprise”, “include”, and “have” are open-end terms. That is, when a certain configuration is included, a configuration other than the foregoing configuration may or may not be included.

Also, in the present specification, when geometric terms and terms representing positional/directional relations are used, for example, when terms such as “parallel”, “orthogonal”, “obliquely at 450”, “coaxial”, and “along” are used, these terms permit manufacturing errors or slight fluctuations. In the present specification, when terms representing relative positional relations such as “upper side” and “lower side” are used, each of these terms is used to indicate a relative positional relation in one state, and the relative positional relation may be reversed or turned at any angle in accordance with an installation direction of each mechanism (for example, the entire mechanism is reversed upside down).

In the present specification, the term “battery” is not limited to a lithium ion battery, and may include other batteries such as a nickel-metal hydride battery and a sodium ion battery. In the present specification, the term “electrode” may collectively represent a positive electrode and a negative electrode. Further, the term “electrode plate” may collectively represent a positive electrode plate and a negative electrode plate.

In the present specification, the “battery cell” can be mounted on vehicles such as a hybrid electric vehicle (HEV), a plug-in hybrid electric vehicle (PHEV), and a battery electric vehicle (BEV). It should be noted that the use of the “battery cell” is not limited to the use in a vehicle.

FIG. 1 is a diagram showing a basic configuration of a battery assembly 1. As shown in FIG. 1, battery assembly 1 includes battery cells 100, end plates 200, and a restraint member 300.

The plurality of battery cells 100 are provided side by side in a Y axis direction (first direction). Thus, a stack of battery cells 100 is formed. Each of battery cells 100 includes electrode terminals 110. A separator (not shown) is interposed between the plurality of battery cells 100. The plurality of battery cells 100, which are sandwiched between two end plates 200, are pressed by end plates 200, and are therefore restrained between two end plates 200.

End plates 200 are disposed on both ends of battery assembly 1 in the Y axis direction. Each of end plates 200 is fixed to a base such as a case that accommodates battery assembly 1. Restraint member 300 connects two end plates 200 to each other.

Restraint member 300 is fixed to end plates 200 with a compression force in the Y axis direction being exerted to the stack of the plurality of battery cells 100 and end plates 200, and then the compression force is released, with the result that tensile force acts on restraint member 300 that connects two end plates 200 to each other. As a reaction thereto, restraint member 300 presses two end plates 200 in directions of bringing them closer to each other.

Figure 2:
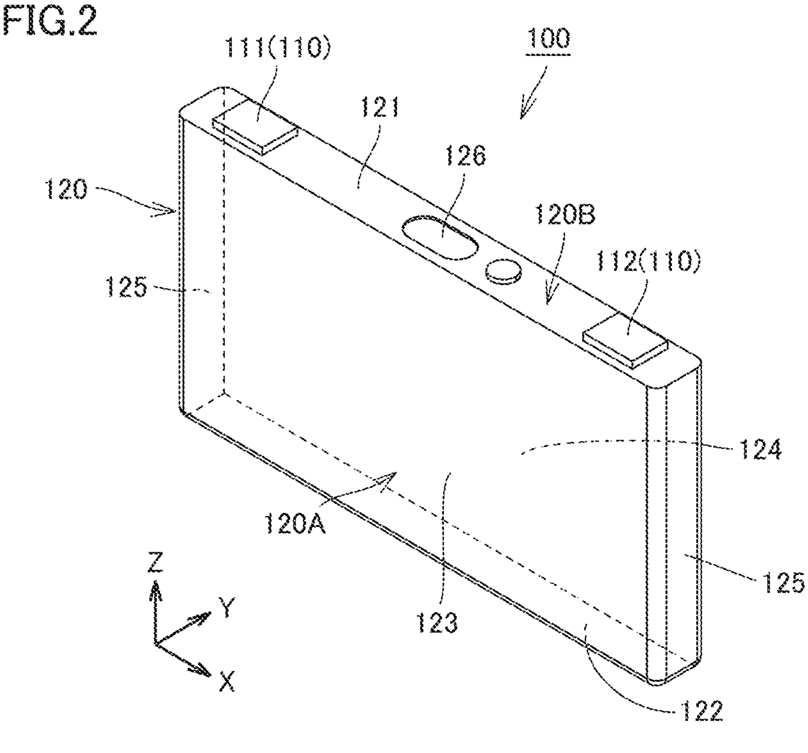
FIG. 2 is a perspective view showing a battery cell.

FIG. 2 is a perspective view showing a battery cell 100. As shown in FIG. 2, battery cell 100 has a prismatic shape. Battery cell 100 has electrode terminals 110, and a housing 120 (exterior container). That is, battery cell 100 is a prismatic secondary battery cell.

Electrode terminals 110 are formed on housing 120. Electrode terminals 110 have a positive electrode terminal 111 and a negative electrode terminal 112 arranged side by side along an X axis direction (second direction) orthogonal to the Y axis direction (first direction). Positive electrode terminal 111 and negative electrode terminal 112 are provided to be separated from each other in the X axis direction.

Housing 120 has a rectangular parallelepiped shape and forms an external appearance of battery cell 100. Housing 120 includes: a case main body 120A that accommodates an electrode assembly (not shown) and an electrolyte solution (not shown); and a sealing plate 120B that seals an opening of case main body 120A. Sealing plate 120B is joined to case main body 120A by welding.

Housing 120 has an upper surface 121, a lower surface 122, a first side surface 123, a second side surface 124, and two third side surfaces 125. Housing 120 is provided with a gas-discharge valve 126.

Upper surface 121 is a flat surface orthogonal to a Z axis direction (third direction) orthogonal to the Y axis direction and the X axis direction. Electrode terminals 110 are disposed on upper surface 121. Lower surface 122 faces upper surface 121 along the Z axis direction.

Each of first side surface 123 and second side surface 124 is constituted of a flat surface orthogonal to the Y axis direction. Each of first side surface 123 and second side surface 124 has the largest area among the areas of the plurality of side surfaces of housing 120. Each of first side surface 123 and second side surface 124 has a rectangular shape when viewed in the Y axis direction. Each of first side surface 123 and second side surface 124 has a rectangular shape in which the X axis direction corresponds to the long-side direction and the Z axis direction corresponds to the short-side direction when viewed in the Y axis direction.

The plurality of battery cells 100 are stacked such that first side surfaces 123 of battery cells 100, 100 adjacent to each other in the Y direction face each other and second side surfaces 124 of battery cells 100, 100 adjacent to each other in the Y axis direction face each other. Thus, positive electrode terminals 111 and negative electrode terminals 112 are alternately arranged in the Y axis direction in which the plurality of battery cells 100 are stacked.

Gas-discharge valve 126 is provided in upper surface 121. When the temperature of battery cell 100 is increased (thermal runaway) and internal pressure of housing 120 becomes more than or equal to a predetermined value due to gas generated inside housing 120, gas-discharge valve 126 discharges the gas to outside of housing 120.

Figure 3:
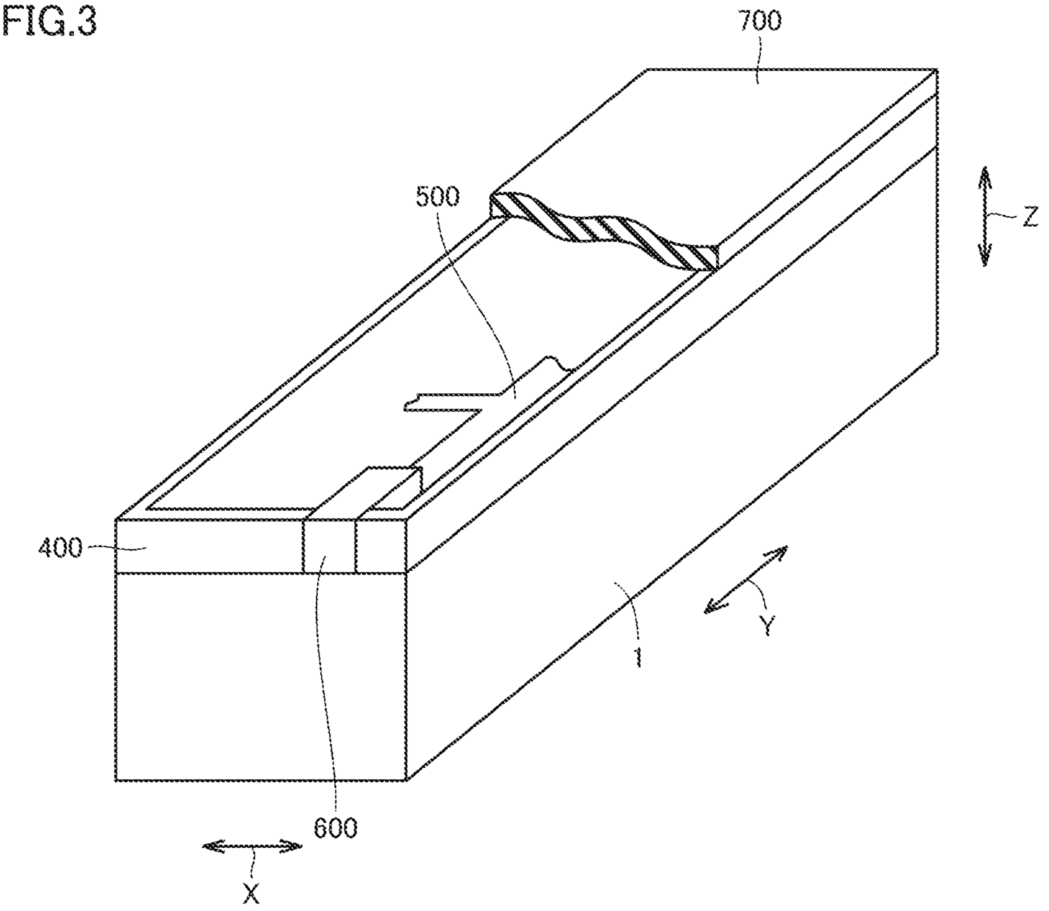
FIG. 3 is a perspective view showing a state in which a wiring module is provided on the battery module.

FIG. 3 is a perspective view showing a state in which a wiring module is provided on battery assembly 1. As shown in FIG. 3, a plate member 400 is placed on battery assembly 1, and a flexible printed board 500 is provided on plate member 400. Flexible printed board 500 can be electrically connected to an external device via a connector 600. A cover member 700 is provided on plate member 400 so as to cover flexible printed board 500.

Figure 4:
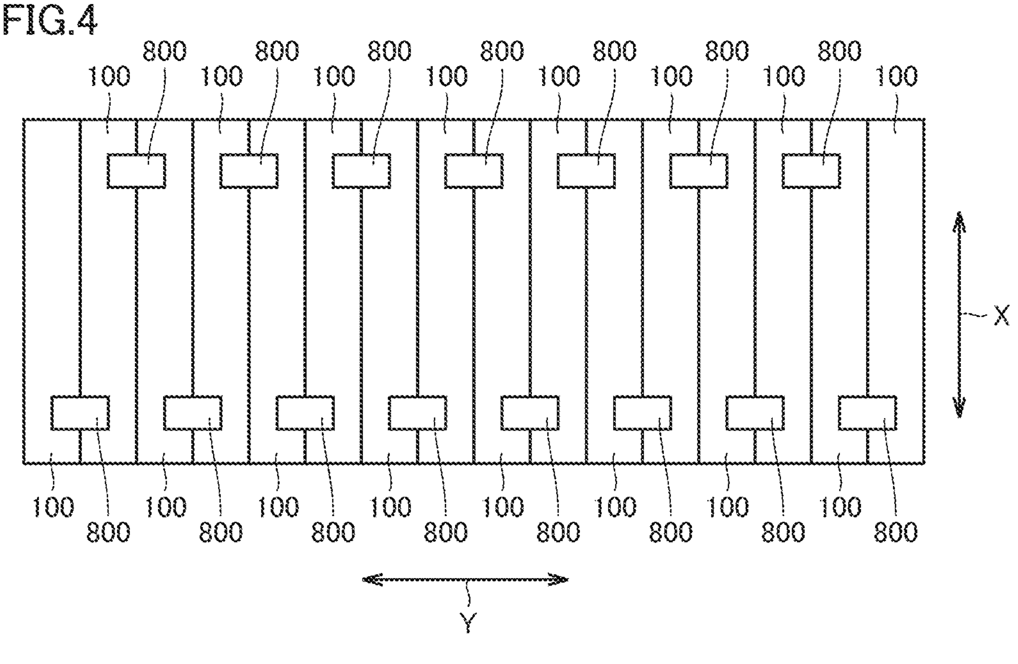
FIG. 4 is a diagram showing an arrangement of bus bars in a battery assembly.

FIG. 4 is a diagram showing an arrangement of bus bars 800 in battery assembly 1. In the example of FIG. 4, positive electrode terminal 111 and negative electrode terminal 112 of adjacent battery cells 100 are electrically connected by bus bar 800, and the plurality of battery cells 100 are electrically connected in series.

That is, battery assembly 1 includes: the plurality of battery cells 100 each having electrode terminals 110 and arranged along a predetermined direction; and bus bars 800 that connect electrode terminals 110 of the plurality of battery cells 100 together.

Figure 5:
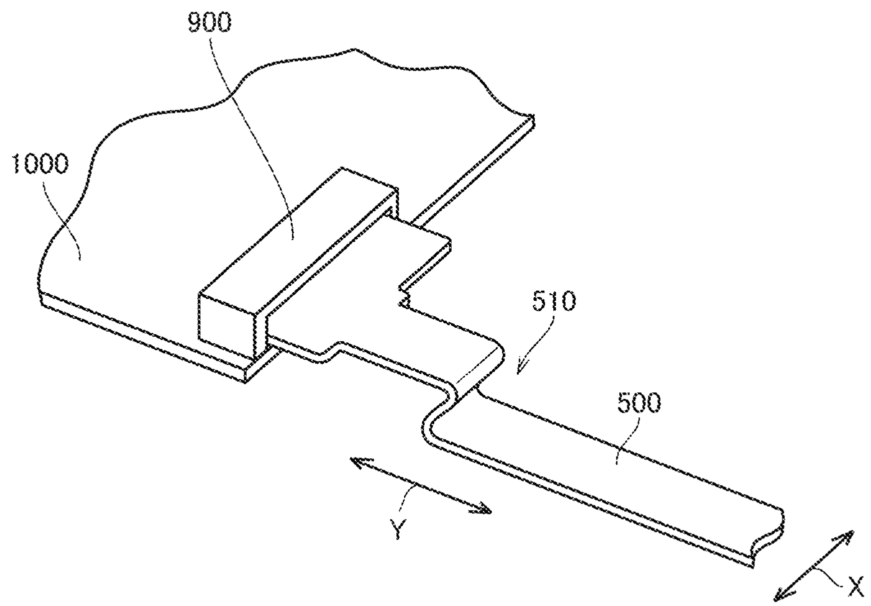
FIG. 5 is a diagram for illustrating deflection of the flexible printed board.

FIG. 5 is a diagram for illustrating deflection of flexible printed board 500. Flexible printed board 500 is connected to a control board 1000 via a connector portion 900. Thus, control board 1000 is electrically connected to flexible printed board 500. Control board 1000 includes a control circuit that controls charging and discharging of each of the plurality of battery cells 100.

Since flexible printed board 500 is likely to be deformed, flexible printed board 500 has deflection with flexible printed board 500 and control board 1000 being connected to each other.

For example, as shown in FIG. 5, when flexible printed board 500 is connected to control board 1000 via connector portion 900, a deflection portion 510 is formed in flexible printed board 500. This may cause unintended rising of flexible printed board 500. The unintended rising of flexible printed board 500 may lead to positional displacement of flexible printed board 500.

Figure 6:
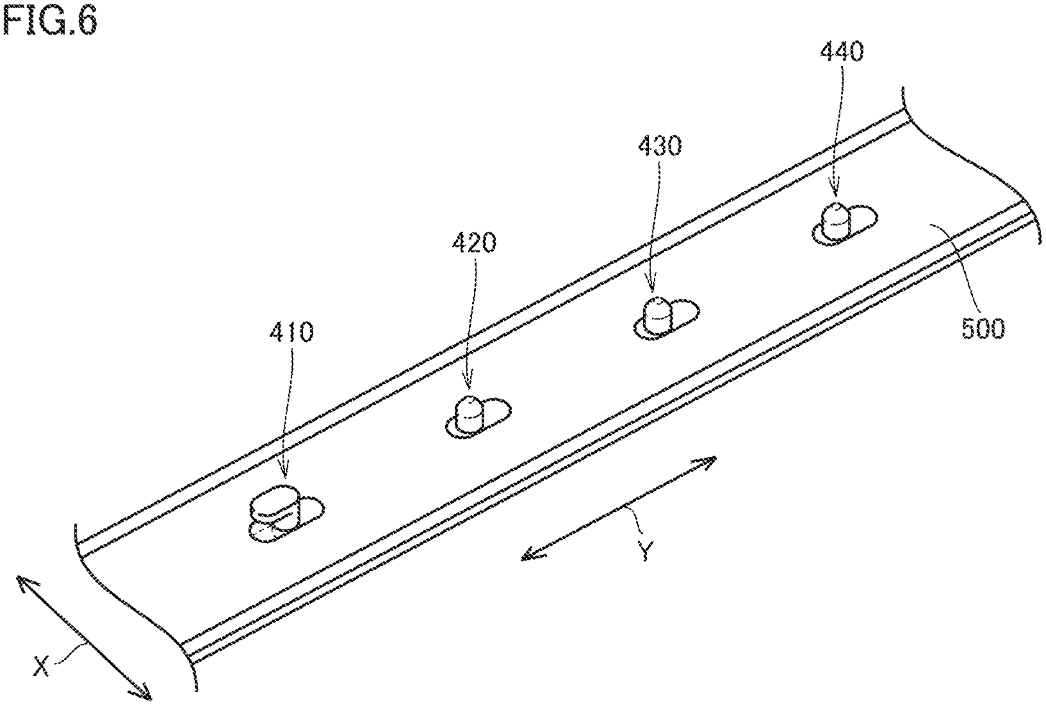
FIG. 6 is a perspective view showing a positioning portion for the flexible printed board.

FIG. 6 is a perspective view showing a positioning portion for flexible printed board 500. As shown in FIG. 6, plate member 400 has protrusions 410, 420, 430, 440, and flexible printed board 500 is positioned on plate member 400 by protrusions 410, 420, 430, 440 being inserted into holes provided in flexible printed board 500. In the battery module according to the present embodiment, flexible printed board 500 is positioned using protrusion 410 closest to connector portion 900.

Figure 7:
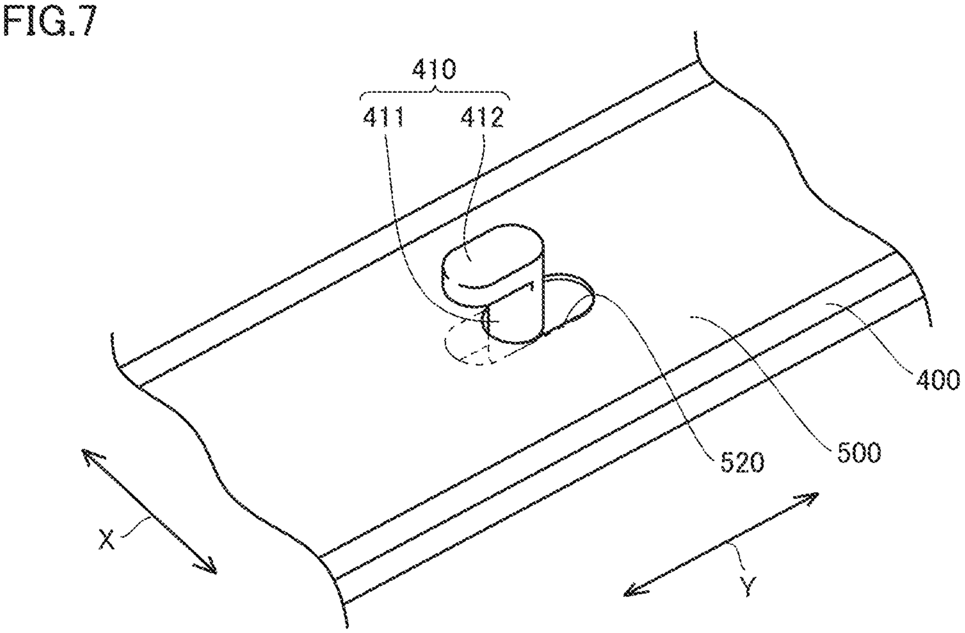
FIG. 7 is a perspective view showing a protrusion included in the positioning portion.

FIG. 7 is a perspective view showing protrusion 410 included in the positioning portion for flexible printed board 500. As shown in FIG. 7, protrusion 410 of plate member 400 is inserted into a hole 520 provided in flexible printed board 500.

When deflection portion 510 is formed in flexible printed board 500, force for sliding flexible printed board 500 acts thereon due to the deflection, thereby pressing the side surface of hole 520 against protrusion 410. Thus, flexible printed board 500 is positioned on plate member 400.

As shown in FIG. 7, protrusion 410 includes: a columnar portion 411 that extends substantially vertically from a main surface of plate member 400; and a projection 412 that projects from columnar portion 411 in a direction intersecting columnar portion 411.

Thus, in the example of FIG. 7, protrusion 410 has a substantially L-shaped longitudinal cross sectional shape, and projection 412 projects from columnar portion 411 toward the connector portion 900 side.

In the example of FIG. 7, hole 520 is an elongated hole extending in the Y axis direction. The side surface of hole 520 is pressed against the protrusion along the extending direction of the elongated hole.

Figure 8:
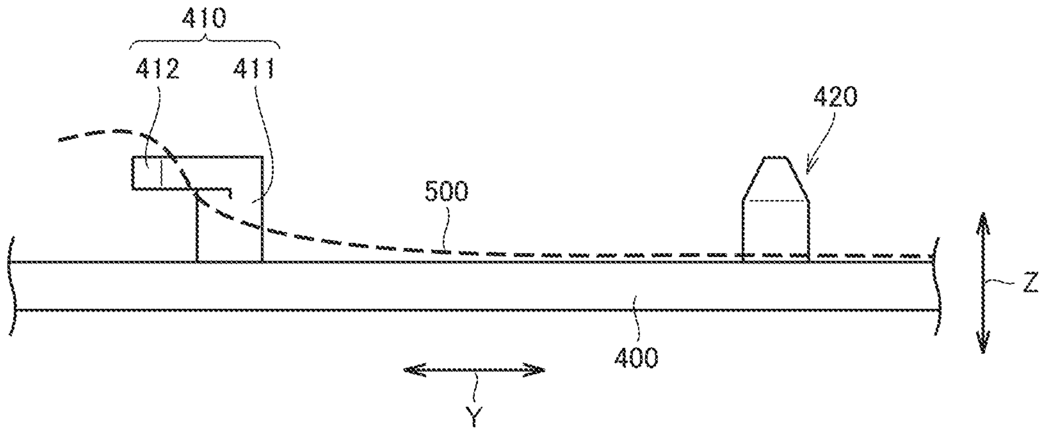
FIG. 8 is a diagram for illustrating a function of positioning by the protrusion.

FIG. 8 is a diagram for illustrating the function of positioning by protrusion 410. As shown in FIG. 8, protrusion 410 is provided with projection 412 that projects from columnar portion 411. Thus, even when force for rising flexible printed board 500 acts thereon due to the deflection at the time of connecting flexible printed board 500 to connector portion 900, projection 412 is engaged therewith to prevent hole 520 of flexible printed board 500 from being removed from protrusion 410. As a result, the assemblability of flexible printed board 500 is improved.

Figure 9:
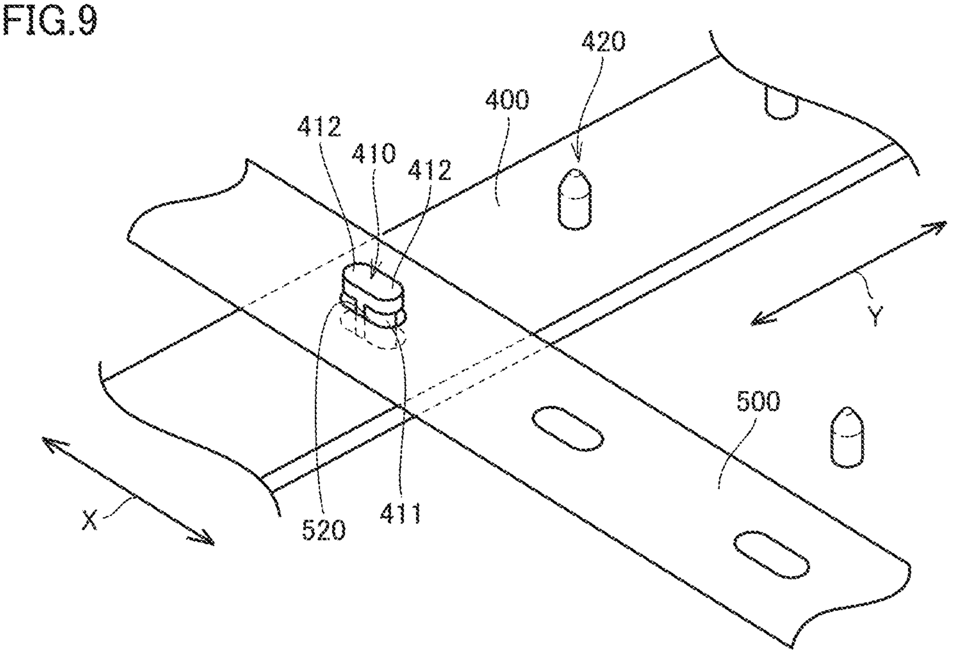
FIG. 9 is a diagram showing a first step in an exemplary process of assembling the flexible printed board.
Figure 10:
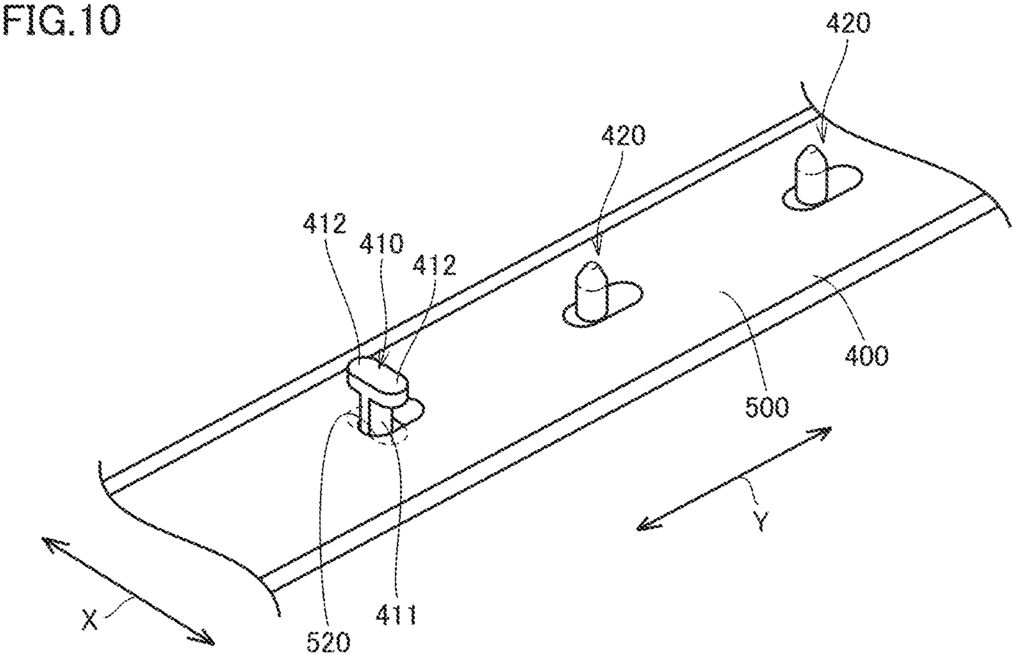
FIG. 10 is a diagram showing a second step in the exemplary process of assembling the flexible printed board.

Each of FIGS. 9 and 10 shows an exemplary process of assembling flexible printed board 500. In the example of FIGS. 9 and 10, projections 412 project from columnar portion 411 toward both sides in the X axis direction.

As shown in FIG. 9, by orienting flexible printed board 500 in the X axis direction, the long-axis direction of hole 520 and the projection direction of each projection 412 can coincide with each other. Therefore, protrusion 410 can be inserted into hole 520.

Here, protrusion 410 can be readily inserted into hole 520 by inclining the upper surface of projection 412 to extend in an obliquely downward direction (direction toward the main surface of plate member 400) as it extends away from columnar portion 411.

After inserting protrusion 410 into hole 520, flexible printed board 500 is rotated to be oriented in the Y axis direction as shown in FIG. 10. Then, flexible printed board 500 is connected to control board 1000 via connector portion 900, and flexible printed board 500 is positioned using the sliding movement due to the deflection.

Figure 11:
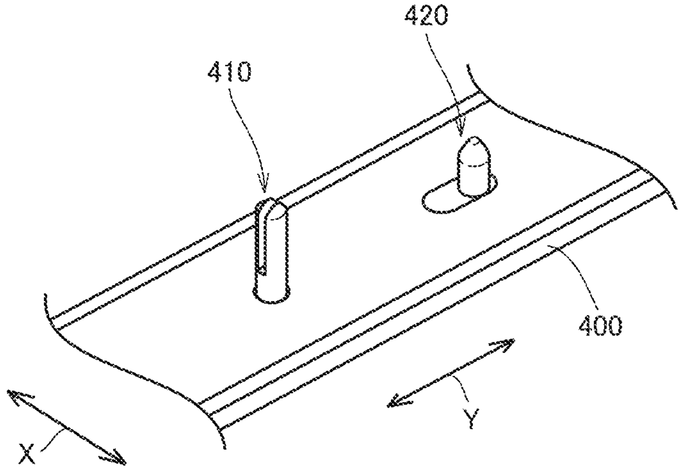
FIG. 11 is a diagram showing a first step in a modification of the process of assembling the flexible printed board.
Figure 12:
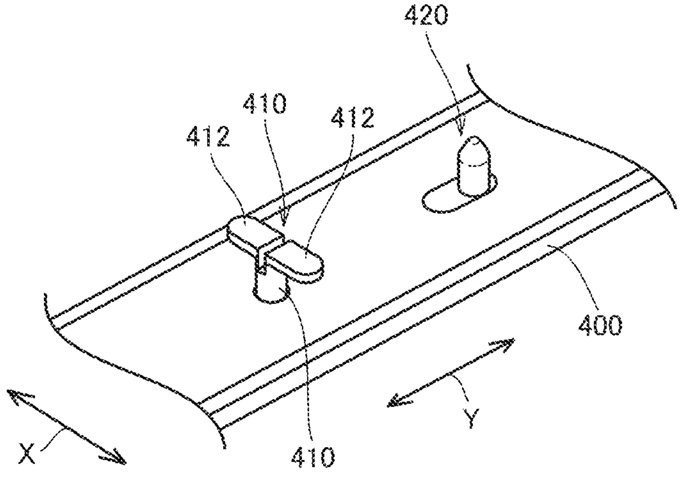
FIG. 12 is a diagram showing a second step in the modification of the process of assembling the flexible printed board.

Each of FIGS. 11 and 12 is a diagram showing a modification of the process of assembling flexible printed board 500. In the example of FIGS. 11 and 12, after protrusion 410 is inserted into hole 520, the tip of protrusion 410 is bent to form projections 412.

Figure 13:
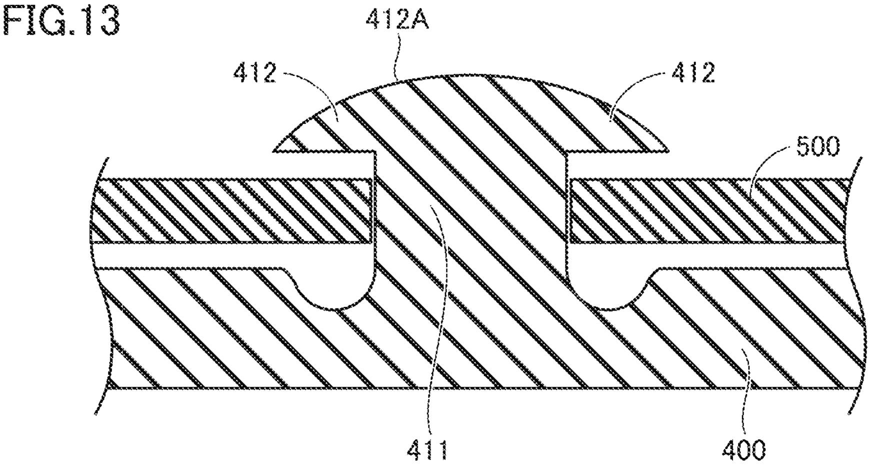
FIG. 13 is a cross sectional view showing a modification of the protrusion.

FIG. 13 is a cross sectional view showing a modification of protrusion 410. In the example of FIG. 13, projection 412 is formed by inserting protrusion 410 into hole 520 and then forming a thermally-swaged portion 412A at the tip of columnar portion 411.

Figure 14:
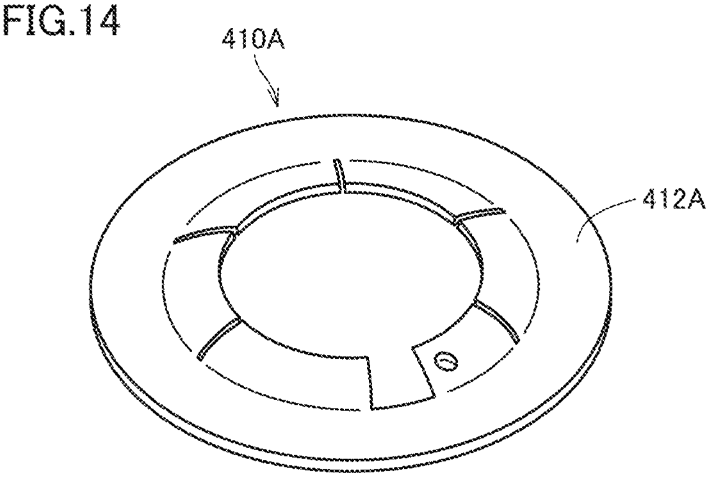
FIG. 14 is a cross sectional view showing a press-fit component in which the protrusion is press-fitted.
Figure 15:
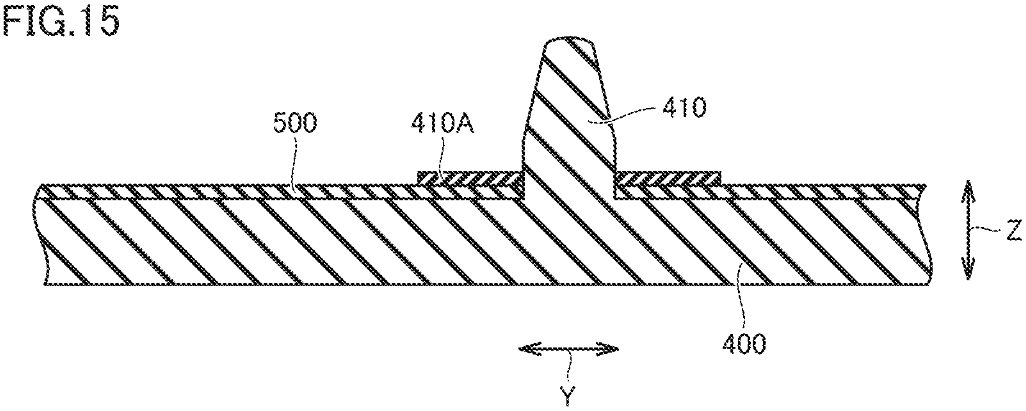
FIG. 15 is a cross sectional view showing the protrusion press-fitted in the press-fit component.

FIG. 14 is a cross sectional view showing a press-fit component 410A in which protrusion 410 is press-fitted. FIG. 15 is a cross sectional view showing protrusion 410 press-fitted in press-fit component 410A. As shown in FIGS. 14 and 15, projection 412 may be formed by inserting protrusion 410 into hole 520 and then press-fitting protrusion 410 in the press-fit component 410A.

Although the embodiments of the present invention have been described and illustrated in detail, it is clearly understood that the same is by way of illustration and example only and is not to be taken by way of limitation, the scope of the present invention being interpreted by the terms of the appended claims. The scope of the present invention is defined by the terms of the claims, and is intended to include any modifications within the scope and meaning equivalent to the terms of the claims.

What is claimed is:

1. A battery module comprising:

a plurality of battery cells arranged in a first direction;

a plate member provided on the plurality of battery cells;

a flexible printed board provided on the plate member;

a control board provided on the plate member and electrically connected to the flexible printed board;

a connector portion provided between the flexible printed board and the control board, wherein the flexible printed board and the control board are electrically connected to each other via the connector portion, the flexible printed board has deflection with the flexible printed board and the control board being connected to each other, a positioning portion for the flexible printed board on the plate member is provided, the positioning portion is provided with a protrusion provided in the plate member and a hole provided in the flexible printed board, and the flexible printed board is positioned by a side surface of the hole being pressed against the protrusion due to the deflection of the flexible printed board, and the protrusion includes a columnar portion that extends substantially vertically from a main surface of the plate member, and a projection that projects from the columnar portion in a direction intersecting the columnar portion.

2. The battery module according to claim 1, wherein the projection projects from the columnar portion toward the connector portion side.

3. The battery module according to claim 1, wherein the hole provided in the flexible printed board is an elongated hole, and a side surface of the elongated hole is pressed against the protrusion along an extending direction of the elongated hole.

4. The battery module according to claim 1, wherein the projection projects from the columnar portion toward the connector portion side, and the hole provided in the flexible printed board is an elongated hole, and a side surface of the elongated hole is pressed against the protrusion along an extending direction of the elongated hole.

5. The battery module according to claim 1, wherein the protrusion has a substantially L-shaped longitudinal cross sectional shape.

6. The battery module according to claim 1, wherein the projection projects from the columnar portion toward the connector portion side, and the protrusion has a substantially L-shaped longitudinal cross sectional shape.

7. The battery module according to claim 1, wherein the hole provided in the flexible printed board is an elongated hole, and a side surface of the elongated hole is pressed against the protrusion along an extending direction of the elongated hole, and the protrusion has a substantially L-shaped longitudinal cross sectional shape.

8. The battery module according to claim 1, wherein the projection projects from the columnar portion toward the connector portion side, the hole provided in the flexible printed board is an elongated hole, and a side surface of the elongated hole is pressed against the protrusion along an extending direction of the elongated hole, and the protrusion has a substantially L-shaped longitudinal cross sectional shape.

9. The battery module according to claim 1, wherein the control board includes a control circuit that controls charging and discharging of each of the plurality of battery cells.

10. The battery module according to claim 1, wherein the projection projects from the columnar portion toward the connector portion side, and the control board includes a control circuit that controls charging and discharging of each of the plurality of battery cells.

11. The battery module according to claim 1, wherein the hole provided in the flexible printed board is an elongated hole, and a side surface of the elongated hole is pressed against the protrusion along an extending direction of the elongated hole, and the control board includes a control circuit that controls charging and discharging of each of the plurality of battery cells.

12. The battery module according to claim 1, wherein the protrusion has a substantially L-shaped longitudinal cross sectional shape, and the control board includes a control circuit that controls charging and discharging of each of the plurality of battery cells.

13. The battery module according to claim 1, wherein the projection projects from the columnar portion toward the connector portion side, the hole provided in the flexible printed board is an elongated hole, and a side surface of the elongated hole is pressed against the protrusion along an extending direction of the elongated hole, and the control board includes a control circuit that controls charging and discharging of each of the plurality of battery cells.

14. The battery module according to claim 1, wherein the projection projects from the columnar portion toward the connector portion side, the protrusion has a substantially L-shaped longitudinal cross sectional shape, and the control board includes a control circuit that controls charging and discharging of each of the plurality of battery cells.

15. The battery module according to claim 1, wherein the hole provided in the flexible printed board is an elongated hole, and a side surface of the elongated hole is pressed against the protrusion along an extending direction of the elongated hole, the protrusion has a substantially L-shaped longitudinal cross sectional shape, and the control board includes a control circuit that controls charging and discharging of each of the plurality of battery cells.

16. The battery module according to claim 1, wherein the projection projects from the columnar portion toward the connector portion side, the hole provided in the flexible printed board is an elongated hole, and a side surface of the elongated hole is pressed against the protrusion along an extending direction of the elongated hole, the protrusion has a substantially L-shaped longitudinal cross sectional shape, and the control board includes a control circuit that controls charging and discharging of each of the plurality of battery cells.

* * * * *